United States Patent
Ko

(10) Patent No.: US 8,526,250 B2
(45) Date of Patent: Sep. 3, 2013

(54) ADDRESS DELAY CIRCUIT OF SEMICONDUCTOR MEMORY APPARATUS

(75) Inventor: Jae Bum Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 89 days.

(21) Appl. No.: 13/219,632

(22) Filed: Aug. 27, 2011

(65) Prior Publication Data

US 2012/0243350 A1  Sep. 27, 2012

(30) Foreign Application Priority Data

Mar. 23, 2011 (KR) .................. 10-2011-0025758

(51) Int. Cl.
*G11C 7/00* (2006.01)
*G11C 11/406* (2006.01)

(52) U.S. Cl.
CPC .................................. *G11C 11/406* (2013.01)
USPC ............... 365/193; 365/230.08; 365/230.01; 365/149; 365/230.06; 365/233.11

(58) Field of Classification Search
CPC ........... G11C 11/406; G11C 11/40615; G11C 11/408; G11C 7/16
USPC ......... 365/230.08, 230.01, 149, 193, 230.06, 365/233.11
See application file for complete search history.

(56) References Cited

U.S. PATENT DOCUMENTS

2012/0008451 A1 * 1/2012 Cha et al. ................. 365/230.03

FOREIGN PATENT DOCUMENTS

JP   2001202780 A   7/2001
KR   100218734 B1   6/1999

* cited by examiner

*Primary Examiner* — Thong Q Le
(74) *Attorney, Agent, or Firm* — William Park & Associates Patent Ltd.

(57) ABSTRACT

An address delay circuit of a semiconductor memory apparatus includes a first group control pulse generation unit configured to generate a first control pulse after input of a first group column address strobe pulse and passage of a time corresponding to a first set multiple of one cycle of a clock, a second group control pulse generation unit configured to generate a second control pulse after input of a second group column strobe address pulse and passage of a time corresponding to a second set multiple of the one cycle of the clock, a first address storage unit configured to receive and store a first group external address in response to the first control pulse, and output a first group internal address, and a second address storage unit configured to receive and store a second group external address in response to the second control pulse, and output a second group internal address.

16 Claims, 5 Drawing Sheets

ADDRESS DELAY CIRCUIT OF SEMICONDUCTOR MEMORY APPARATUS

CROSS-REFERENCES TO RELATED APPLICATION

The present application claims priority under 35 U.S.C. §119(a) to Korean application number 10-2011-0025758, filed on Mar. 23, 2011, in the Korean Intellectual Property Office, which is incorporated herein by reference in its entirety as set forth in full.

BACKGROUND

1. Technical Field

The present invention relates to a semiconductor integrated circuit, and more particularly, to an address delay circuit of a semiconductor memory apparatus.

2. Related Art

In general, an address delay circuit of a semiconductor memory apparatus delays an external address received from the outside of the semiconductor memory apparatus and outputs an internal address.

FIG. 1 is a diagram illustrating an address delay circuit 16 of a known semiconductor memory apparatus, which illustrates an example in which three external addresses Address<0:2> are output as three internal addresses Address_dl<0:2> after five cycles of a clock CLK pass.

Referring to FIG. 1, the address delay circuit 16 of the general semiconductor memory apparatus includes first, second, . . . , and fifteenth flip-flops 1, 2, . . . , and 15.

The first, second, . . . , and fifth flip-flops 1, 2, . . . , and 5 are serially connected to one another. The first flip-flop 1 receives a first external address Address<0> and the fifth flip-flop 5 outputs a first internal address Address_dl<0>.

The sixth, seventh, . . . , and tenth flip-flops 6, 7, . . . , and 10 are serially connected to one another. The sixth flip-flop 6 receives a second external address Address<1> and the tenth flip-flop 10 outputs a second internal address Address_dl<1>.

The eleventh, twelfth, . . . , and fifteenth flip-flops 11, 12, . . . , and 15 are serially connected to one another. The eleventh flip-flop 11 receives a third external address Address<2> and the fifteenth flip-flop 15 outputs a third internal address Address_dl<2>.

Each of the first, second, . . . , and fifteenth flip-flops 1, 2, . . . , and 15 performs input, storage, and output operations in response to the clock CLK, respectively.

Referring to FIG. 1, the address delay circuit 16 of the known semiconductor memory apparatus requires a plurality of flip-flops serially connected one another in order to delay one external address to output one internal address. In detail, the flip-flops serially connected one another, which correspond to the number of clock cycles, are required according to a delay time, that is, cycles of a clock to be delayed. Therefore, with an increase in the number of external addresses of a semiconductor memory apparatus and a delay time, since a large number of flip-flops are required, an area of an address delay circuit may increase and current consumption may also increase.

SUMMARY

An address delay circuit of a semiconductor memory apparatus capable of reducing a circuit area and current consumption thereof while operating with a delay time substantially the same as that of an address delay circuit of a general semiconductor memory apparatus is described herein.

In an embodiment of the present invention, an address delay circuit of a semiconductor memory apparatus includes: a first group control pulse generation unit configured to generate a first control pulse after input of a first group column address strobe pulse and passage of a time corresponding to a first set multiple for one cycle of a clock; a second group control pulse generation unit configured to generate a second control pulse after input a second group column strobe address pulse is input and passage of a time corresponding to a second set multiple for the one cycle of the clock; a first address storage unit configured to receive and store a first group external address in response to the first control pulse, and output a first group internal address; and a second address storage unit configured to receive and store a second group external address in response to the second control pulse, and output a second group internal address.

In an embodiment of the present invention, an address delay circuit of a semiconductor memory apparatus includes: a first group control pulse generation unit configured to generate a first control pulse when a first group column address strobe pulse is input and one cycle of a clock passes, and generate a second control pulse when a first set cycle of the clock passes after the first group column address strobe pulse is input; a second group control pulse generation unit configured to generate a third control pulse when a second group column strobe address pulse is input and the one cycle of the clock passes, and generate a fourth control pulse when a second set cycle of the clock passes after the second group column address strobe pulse is input; a first address storage unit configured to receive, store and output a first group external address in response to the first control pulse; a second address storage unit configured to receive and store output of the first address storage unit in response to the second control pulse, and output a first group internal address; a third address storage unit configured to receive, store and output a second group external address in response to the third control pulse; and a fourth address storage unit configured to receive and store output of the third address storage unit in response to the fourth control pulse, and output a second group internal address.

In an embodiment of the present invention, an address delay circuit of a semiconductor memory apparatus includes: a first group control pulse generation unit including a first flip-flop configured to receive a first group column address strobe pulse and generate a first control pulse, and second and third flip-flops configured to receive output of the first flip-flop and generate a second control pulse, the second flip-flop and the third flip-flop being serially connected to each other; a second group control pulse generation unit including a fourth flip-flop configured to receive a second group column address strobe pulse and generate a third control pulse, and fifth and sixth flip-flops configured to receive output of the fourth flip-flop and generate a fourth control pulse, the fifth flip-flop and the sixth flip-flop being serially connected to each other; a first address storage unit including a seventh flip-flop configured to receive, store and output a first group external address in response to the first control pulse; a second address storage unit including an eighth flip-flop configured to receive and store output of the first address storage unit in response to the second control pulse, and output a first group internal address; a third address storage unit including a ninth flip-flop configured to receive, store and output a second group external address in response to the third control pulse; and a fourth address storage unit including a tenth flip-flop configured to receive and store output of the third address storage unit in response to the fourth control pulse, and output a second group internal address.

BRIEF DESCRIPTION OF THE DRAWINGS

Features, aspects, and embodiments are described in conjunction with the attached drawings, in which.

DETAILED DESCRIPTION

Hereinafter, an address delay circuit of a semiconductor memory apparatus according to the present invention will be described in detail with reference to the accompanying drawings through exemplary embodiments.

Figure 2:
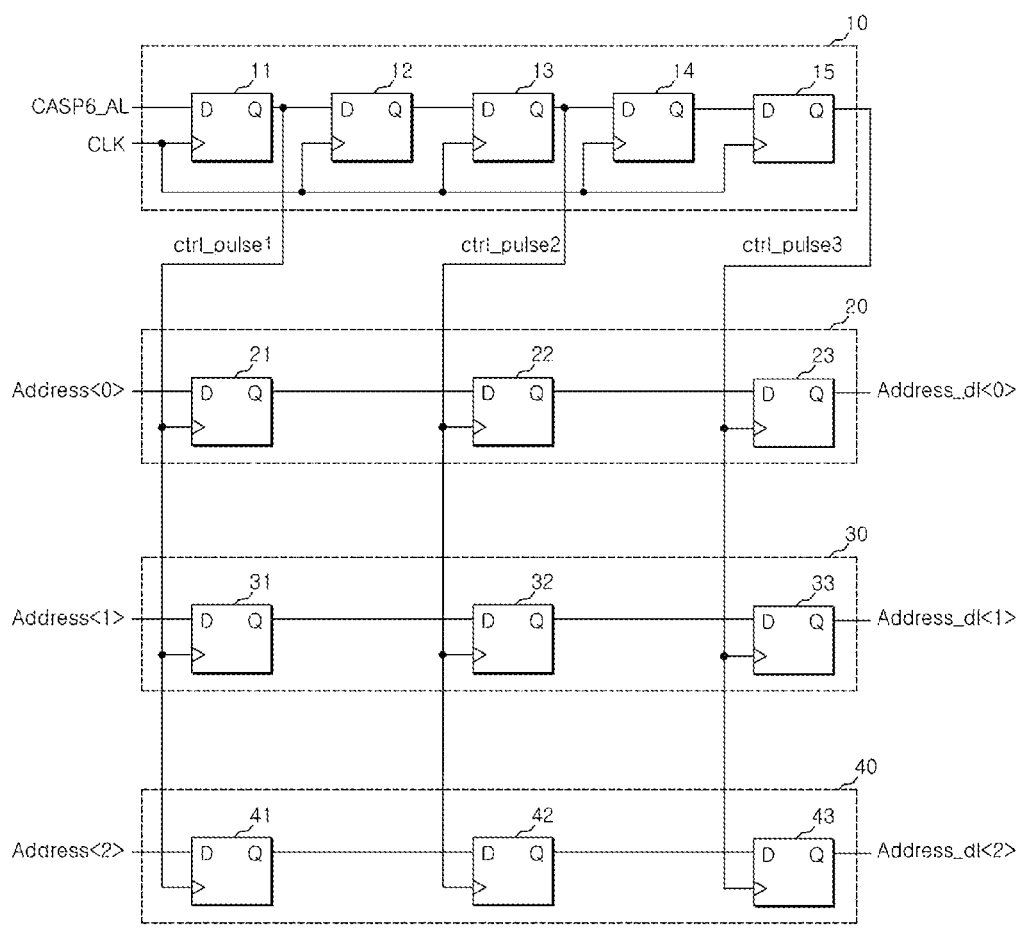
FIG. 2 is a configuration diagram of an address delay circuit of a semiconductor memory apparatus according to an embodiment.

Referring to FIG. 2, an address delay circuit 50 of a semiconductor memory apparatus according to an embodiment includes a control pulse generation unit 10, and first, second and third delay units 20, 30 and 40.

When a column address strobe pulse CASP6_AL is input and one cycle of a clock CLK passes, the control pulse generation unit 10 generates a first control pulse ctrl_pulse1. When the first control pulse ctrl_pulse1 is generated and two cycles of the clock CLK pass, the control pulse generation unit 10 generates a second control pulse ctrl_pulse2. When the second control pulse ctrl_pulse2 is generated and the two cycles of the clock CLK pass, the control pulse generation unit 10 generates a third control pulse ctrl_pulse3. The column address strobe pulse CASP6_AL is generated when the semiconductor memory apparatus performs a read operation or a write operation.

The control pulse generation unit 10 includes first, second, . . . , and fifth flip-flops 11, 12, . . . , and 15 serially connected to one another. Each of the first, second, . . . , and fifth flip-flops 11, 12, . . . , and 15 performs input, storage, and output operations in response to the clock CLK. The first flip-flop 11 is configured to receive the column address strobe pulse CASP6_AL and output the first control pulse ctrl_pulse1. The third flip-flop 13 is configured to output the second control pulse ctrl_pulse2. The fifth flip-flop 15 is configured to output the third control pulse ctrl_pulse3.

The first delay unit 20 is configured to delay a first external address Address<0> in response to the first, second and third control pulses ctrl_pulse1, ctrl_pulse2 and ctrl_pulse3, and output a delayed address as a first internal address Address_dl<0>.

The first delay unit 20 includes sixth, seventh and eighth flip-flops 21, 22 and 23 serially connected to one another. The sixth flip-flop 21 is configured to receive, store and output the first external address Address<0>. Here, the sixth flip-flop 21 operates in response to the first control pulse ctrl_pulse1. The seventh flip-flop 22 is configured to receive, store and output the output signal of the sixth flip-flop 21. Here, the seventh flip-flop 22 operates in response to the second control pulse ctrl_pulse2. The eighth flip-flop 23 is configured to receive and store the output signal of the seventh flip-flop 22 in response to the third control pulse ctrl_pulse3, and output the first internal address Address_dl<0>.

The second delay unit 30 is configured to delay a second external address Address<1> in response to the first, second and third control pulses ctrl_pulse1, ctrl_pulse2 and ctrl_pulse3, and output a delayed address as a second internal address Address_dl<1>.

The second delay unit 30 includes ninth, tenth and eleventh flip-flops 31, 32 and 33 serially connected to one another. The ninth flip-flop 31 is configured to receive, store and output the second external address Address<1>. Here, the ninth flip-flop 31 operates in response to the first control pulse ctrl_pulse1. The tenth flip-flop 32 is configured to receive, store and output the output signal of the ninth flip-flop 31. Here, the tenth flip-flop 32 operates in response to the second control pulse ctrl_pulse2. The eleventh flip-flop 33 is configured to receive and store the output signal of the tenth flip-flop 32. Here, the eleventh flip-flop 33 operates in response to the third control pulse ctrl_pulse3, and output the second internal address Address_dl<1>.

The third delay unit 40 is configured to delay a third external address Address<2> in response to the first, second and third control pulses ctrl_pulse1, ctrl_pulse2 and ctrl_pulse3, and output a delayed address as a third internal address Address_dl<2>.

The third delay unit 40 includes twelfth, thirteenth and fourteenth flip-flops 41, 42 and 43 serially connected to one another. The twelfth flip-flop 41 is configured to receive, store and output the third external address Address<2>. Here, the twelfth flip-flop 41 operates in response to the first control pulse ctrl_pulse1. The thirteenth flip-flop 42 is configured to receive, store and output the output signal of the twelfth flip-flop 41. Here, the thirteenth flip-flop 42 operates in response to the second control pulse ctrl_pulse2. The fourteenth flip-flop 43 is configured to receive and store the output signal of the thirteenth flip-flop 42. Here, the fourteenth flip-flop 43 operates in response to the third control pulse ctrl_pulse3, and output the third internal address Address_dl<2>.

The operation of the address delay circuit 50 of the semiconductor memory apparatus configured above according to an embodiment will be described with reference to FIG. 2 below.

When a read or write command is input to the semiconductor memory apparatus and a read or write operation is performed, the column address strobe pulse CASP6_AL is generated.

When the column address strobe pulse CASP6_AL is input and one cycle of the clock CLK passes, the control pulse generation unit 10 generates the first control pulse ctrl_pulse1. When the first control pulse ctrl_pulse1 is generated and the two cycles of the clock CLK pass, the control pulse generation unit 10 generates the second control pulse ctrl_pulse2. When the second control pulse ctrl_pulse2 is generated and the two cycles of the clock CLK pass, the control pulse generation unit 10 generates the third control pulse ctrl_pulse3.

Since the first, second and third delay units 20, 30 and 40 may have substantially the same configurations and perform substantially the same operations, except for a difference in the input external addresses, only the operation of the first delay unit 20 will be described.

The first delay unit 20 includes the sixth, seventh and eighth flip-flops 21, 22 and 23 serially connected to one another. When the first control pulse ctrl_pulse1 is input, the sixth flip-flop 21 receives, stores and outputs the first external address Address<0>. When the second control pulse ctrl_ pulse2 is input, the seventh flip-flop 22 receives, stores and outputs the output signal of the sixth flip-flop 21. When the third control pulse ctrl_pulse3 is input, the eighth flip-flop 23 receives and stores the output signal of the seventh flip-flop 22, and outputs the first internal address Address_dl<0>.

As a result, when the column address strobe pulse CASP6_AL is input and five cycles of the clock CLK pass, the first delay unit 20 outputs the first external address Address<0>, received when the column address strobe pulse CASP6_AL is input, as the first internal address Address_dl<0>.

In the same manner, when the column address strobe pulse CASP6_AL is input and the five cycles of a clock CLK pass, the second and third delay units 30 and 40, which have substantially the same configurations as that of the first delay unit 20, output the second external address Address<1> and the third external address Address<2>, received when the column address strobe pulse CASP6_AL is input, as the second internal address Address_dl<1> and the third internal address Address_dl<2>, respectively.

Figure 1:
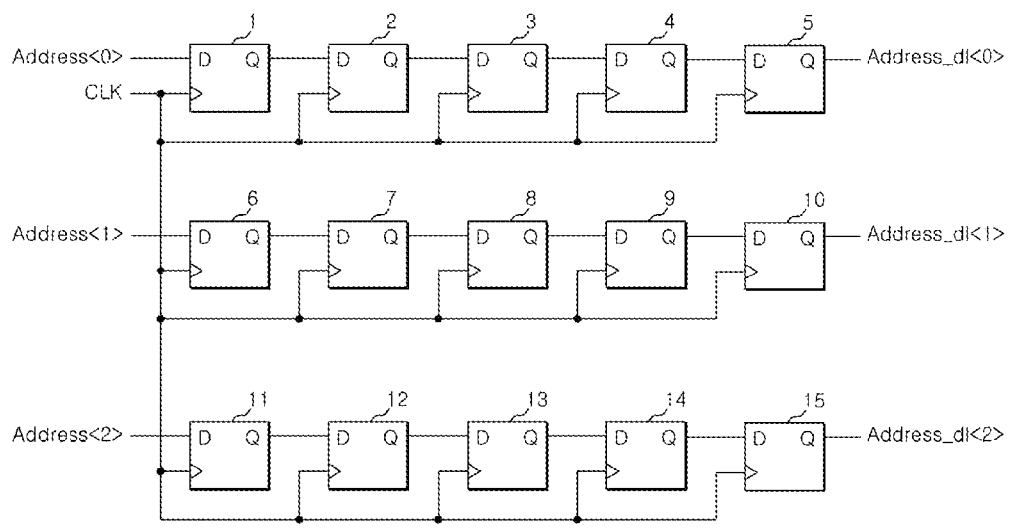
FIG. 1 is a configuration diagram of an address delay circuit of a general semiconductor memory apparatus.

The address delay circuit 50 of the semiconductor memory apparatus illustrated in FIG. 2 according to an embodiment is configured to delay the three external addresses by the five cycles of the clock. However, it is apparent to those skilled in the art that the number of the external addresses and a delay time (a set cycle of the clock) may vary. Since the number of flip-flops used in the known art as illustrated in FIG. 1 is 15 and the number of flip-flops used in an embodiment as illustrated in FIG. 2 is 14, it may be determined that the number of flip-flops is reduced by one in an embodiment as compared with the known art. However, when the number of the external addresses and the delay time (the set cycle of the clock) increase, it is possible to reduce significantly the number of flip-flops in an embodiment as compared with the known art.

The delay-type address delay circuit 16 illustrated in FIG. 1 is configured to delay the three external addresses by the five cycles of the clock. The delay-type address delay circuit 16 illustrated in FIG. 1 requires flip-flops corresponding to a result obtained by multiplying the number of the external addresses by the delay time, that is, the set cycle of the clock. That is, the number of the flip-flops is 25, which are necessary for delaying five external addresses by the five cycles of the clock.

However, the address delay circuit 50 according to an embodiment requires five flip-flops configured to the control pulse generation unit 10 in order to perform a delay operation corresponding to the five cycles of the clock, and 15 flip-flops used in order to delay the five external addresses. That is, in an embodiment, the number of flip-flops used for delaying the five external addresses by the five cycles of the clock can be reduced by five, as compared with the known art. Consequently, it is apparent that when the number of the external addresses and the delay time (the set cycle of the clock) are increased, it is possible to reduce significantly the number of flip-flops in an embodiment as compared with the known art.

The address delay circuit 50 of the semiconductor memory apparatus illustrated in FIG. 2 according to an embodiment may operate when an external address value is substantially maintained for two cycles of the clock CLK. If when a change occurs in the external address value in a time shorter than the two cycles of the clock, the address delay circuit 50 may not be used.

As a semiconductor memory apparatus operates at a high speed, the frequency of a clock increases. Thus, a time corresponding to two cycles of the clock decreases.

In general, a flip-flop may normally operate only when a set up/hold time of an input signal is satisfied.

However, as a semiconductor memory apparatus operates at a high speed, the frequency of a clock increases and thus a set up/hold time of an external address decreases, so that the address delay circuit 50 of the semiconductor memory apparatus illustrated in FIG. 2 may not normally operate when the set up/hold time of the input signal is not satisfied.

Figure 3:
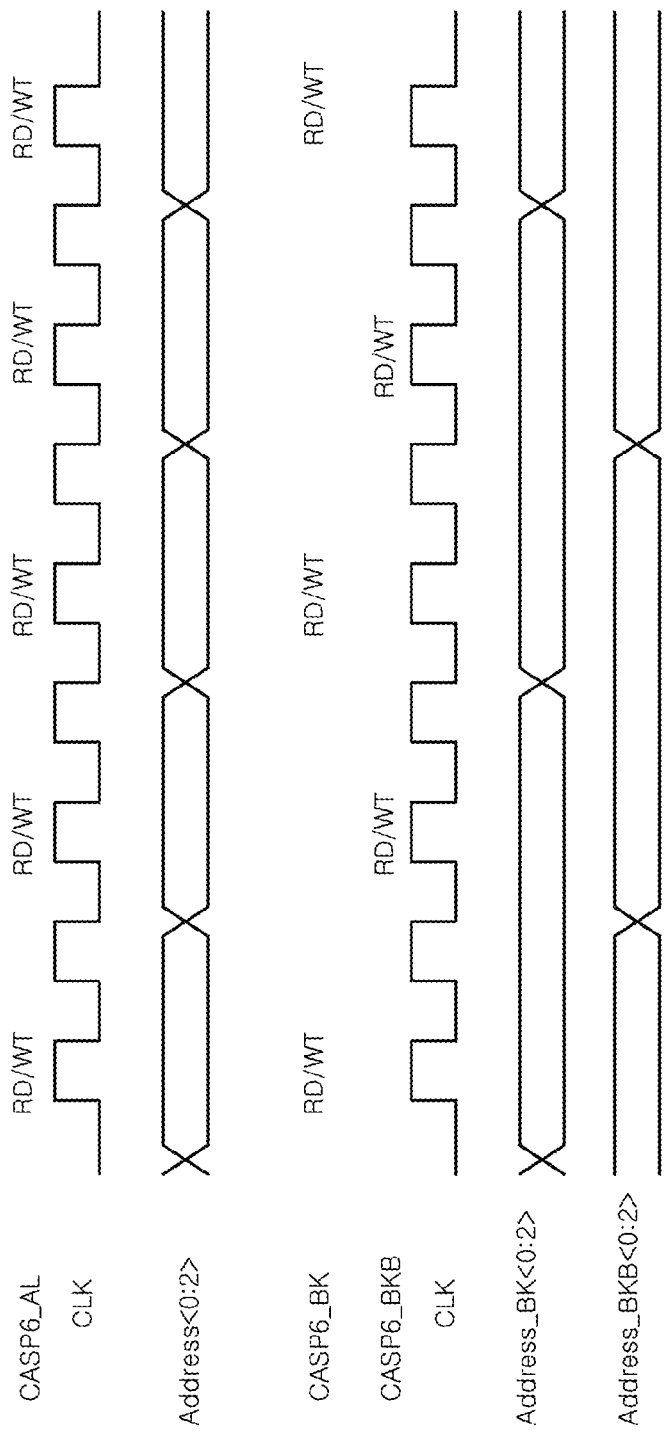
FIG. 3 is a timing diagram explaining an address delay circuit of a semiconductor memory apparatus according to an embodiment.

FIG. 3 is a timing diagram explaining a method capable of improving a setup/hold margin of an external address with an increase in the frequency of a clock. FIG. 3 illustrates an example of a semiconductor memory apparatus capable of performing a read or write operation every two cycles of the clock.

Referring to FIG. 3, in the address delay circuit 50 of the semiconductor memory apparatus illustrated in FIG. 2, the column address strobe pulse CASP6_AL is also generated every two cycles of the clock according to a read or write command RD/WT which is input every two cycles of the clock CLK. At this time, the first, second and third external addresses Address<0:2> substantially maintain their own values for the two cycles of the clock.

An address delay circuit of a semiconductor memory apparatus according to an embodiment can be used for a semiconductor memory apparatus in which banks of the semiconductor memory apparatus are divided into a first group and a second group, and when a read or write command is input to the banks of the first group, a next read or write command is input to the banks of the second group.

In the address delay circuit of the semiconductor memory apparatus according to an embodiment, the read or write operation is executed every two cycles of the clock and external addresses Address_BK<0:2> and Address_BKB<0:2> can be substantially maintained for four cycles of the clock, so that it is possible to increase a signal margin.

Figure 4:
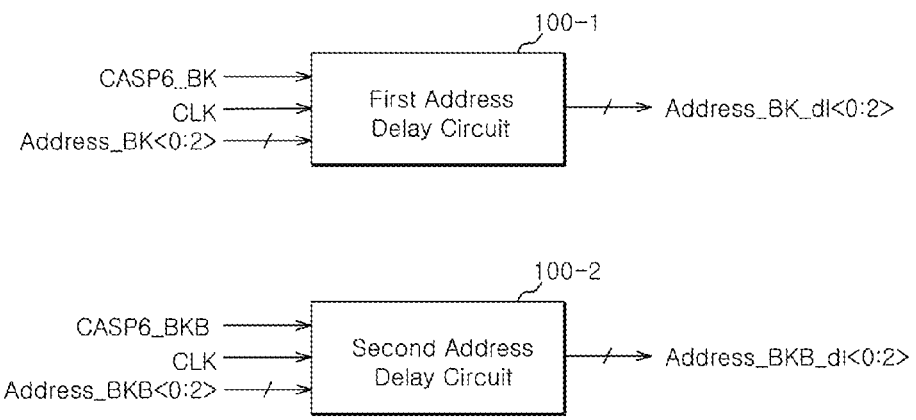
FIG. 4 is a configuration diagram of an address delay circuit of a semiconductor memory apparatus according to an embodiment.

Referring to FIG. 4, the address delay circuit 100-3 of the semiconductor memory apparatus includes a first address delay circuit 100-1 and a second address delay circuit 100-2.

The first address delay circuit 100-1 is configured to receive a first group external addresses Address_BK<0:2> when a first group column address strobe pulse CASP6_BK is input, and output the stored first group external addresses Address_BK<0:2> as a first group internal addresses Address_BK_dl<0:2> when a preset cycle of a clock CLK passes.

The second address delay circuit 100-2 is configured to receive a second group external addresses Address_BKB<0:2> when a second group column address strobe pulse CASP6_BKB is input, and output the stored second group external addresses Address_BKB<0:2> as a second group internal addresses Address_BKB_dl<0:2> when the preset cycle of the clock CLK passes.

The first address delay circuit 100-1 and the second address delay circuit 100-2 may have substantially the same internal configuration, and may be configured illustrated in FIG. 2, respectively. Each of the first address delay circuit 100-1 and the second address delay circuit 100-2 includes a control pulse generation unit 10, and first, second and third delay units 20, 30 and 40. Since connections, configurations and operations of the control pulse generation unit 10 and the first, second and third delay units 20, 30 and 40 have been described above, description thereof will be omitted.

The address delay circuit 100-3 of the semiconductor memory apparatus configured above according to an embodiment can increase the signal margin. However, since it is necessary to arrange the first address delay circuit 100-1 and the second address delay circuit 100-2 having substantially the same configuration as that of the address delay circuit 50 illustrated in FIG. 2, a circuit area increases twice as large as the address delay circuit 50 according to an embodiment.

In this regard, an address delay circuit 400 of a semiconductor memory apparatus according to an embodiment can minimize the circuit area while maximizing the margin of an external address.

Figure 5:
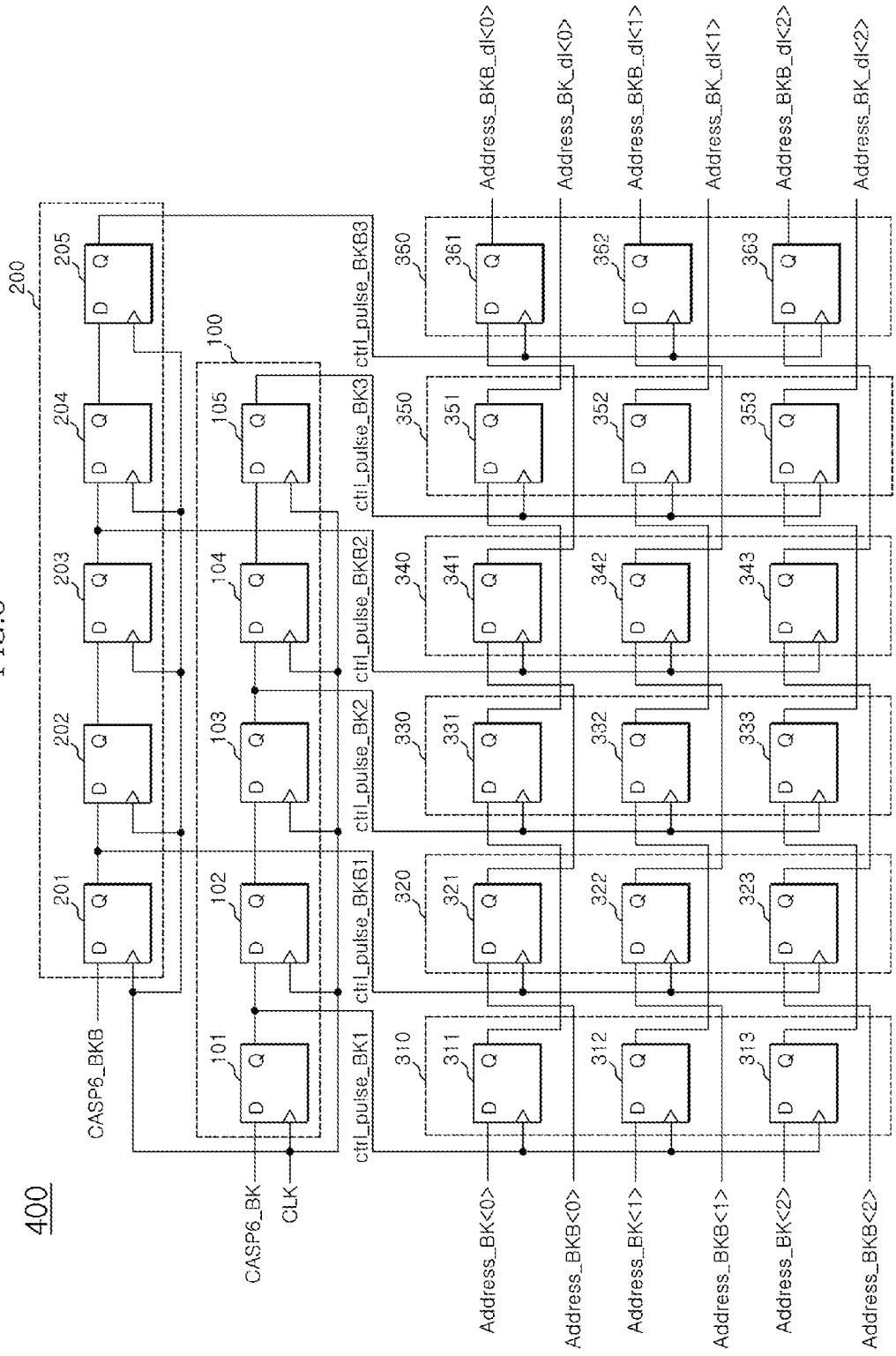
FIG. 5 is a configuration diagram of an address delay circuit of a semiconductor memory apparatus according to an embodiment.

Referring to FIG. 5, the address delay circuit 400 of the semiconductor memory apparatus according to an embodiment includes a first group control pulse generation unit 100, a second group control pulse generation unit 200, and first, second, . . . , and sixth address storage units 310, 320, . . . , and 360.

When a first group column address strobe pulse CASP6_BK is input and one cycle of a clock CLK passes, the first group control pulse generation unit 100 generates a first control pulse ctrl_pulse_BK1. When the first control pulse ctrl_pulse_BK1 is generated and two cycles of the clock CLK pass, the first group control pulse generation unit 100 generates a second control pulse ctrl_pulse_BK2. When the second control pulse ctrl_pulse_BK2 is generated and the two cycles of the clock CLK pass, the first group control pulse generation unit 100 generates a third control pulse ctrl_pulse_BK3.

The first group control pulse generation unit 100 includes first, second, . . . , and fifth flip-flops 101, 102, . . . , and 105 serially connected one another. The first flip-flop 101 is configured to receive the first group column address strobe pulse CASP6_BK and the clock CLK and generate the first control pulse ctrl_pulse_BK1. The second flip-flop 102 is configured to receive the output signal of the first flip-flop 101 and the clock CLK. The third flip-flop 103 is configured to receive the output signal of the second flip-flop 102 and the clock CLK, and generate the second control pulse ctrl_pulse_BK2. The fourth flip-flop 104 is configured to receive the output signal of the third flip-flop 103 and the clock CLK. The fifth flip-flop 105 is configured to receive the output signal of the fourth flip-flop 104 and the clock CLK, and generate the third control pulse ctrl_pulse_BK3.

When a second group column address strobe pulse CASP6_BKB is input and the one cycle of the clock CLK passes, the second group control pulse generation unit 200 generates a fourth control pulse ctrl_pulse_BKB1. When the fourth control pulse ctrl_pulse_BKB1 is generated and the two cycles of the clock CLK pass, the second group control pulse generation unit 200 generates a fifth control pulse ctrl_pulse_BKB2. When the fifth control pulse ctrl_pulse_BKB2 is generated and the two cycles of the clock CLK pass, the second group control pulse generation unit 200 generates a sixth control pulse ctrl_pulse_BKB3.

The second group control pulse generation unit 200 includes sixth, seventh, . . . , and tenth flip-flops 201, 202, . . . , and 205 serially connected one another. The sixth flip-flop 201 is configured to receive the second group column address strobe pulse CASP6_BKB and the clock CLK, and generate the fourth control pulse ctrl_pulse_BKB1. The seventh flip-flop 202 is configured to receive the output signal of the sixth flip-flop 201 and the clock CLK. The eighth flip-flop 203 is configured to receive the output signal of the seventh flip-flop 202 and the clock CLK, and generate the fifth control pulse ctrl_pulse_BKB2. The ninth flip-flop 204 is configured to receive the output signal of the eighth flip-flop 203 and the clock CLK. The tenth flip-flop 205 is configured to receive the output signal of the ninth flip-flop 204 and the clock CLK, and generate the sixth control pulse ctrl_pulse_BKB3.

The first address storage unit 310 is configured to receive and store first group external addresses Address_BK<0:2> in response to the first control pulse ctrl_pulse_BK1. That is, when a read or write command is input to the semiconductor memory apparatus, according to an example, the first group column address strobe pulse CASP6_BK is generated and the one cycle of the clock CLK passes, the first address storage unit 310 receives and stores the first group external addresses Address_BK<0:2>.

The first address storage unit 310 includes eleventh, twelfth and thirteenth flip-flops 311, 312 and 313. The eleventh, twelfth and thirteenth flip-flops 311, 312 and 313 are configured to receive, store, and output the first group external addresses Address_BK<0:2>. Here, the eleventh, twelfth and thirteenth flip-flops 311, 312 and 313 operate in response to the first control pulse ctrl_pulse_BK1.

The second address storage unit 320 is configured to receive and store second group external addresses Address_BKB<0:2> in response to the fourth control pulse ctrl_pulse_BKB1. That is, when a read or write command regarding a first group of banks of the semiconductor memory apparatus is input and then a next read or write command is input, and the one cycle of the clock CLK passes, the second address storage unit 320 receives and stores the second group external addresses Address_BKB<0:2> regarding a second group of the banks of the semiconductor memory apparatus.

The second address storage unit 320 includes fourteenth, fifteenth and sixteenth flip-flops 321, 322 and 323. The fourteenth, fifteenth and sixteenth flip-flops 321, 322 and 323 are configured to receive, store, and output the second group external addresses Address_BKB<0:2>. Here, the fourteenth, fifteenth and sixteenth flip-flops 321, 322 and 323 operate in response to the fourth control pulse ctrl_pulse_BKB1.

The third address storage unit 330 is configured to receive and store the output of the first address storage unit 310 in response to the second control pulse ctrl_pulse_BK2. According to an example, when the first group column address strobe pulse CASP6_BK is generated and three cycles of the clock CLK pass, the third address storage unit 330 receives and stores the first group external addresses Address_BK<0:2> received when the one cycle of the clock CLK passes after the first group column address strobe pulse CASP6_BK is generated.

The third address storage unit 330 includes seventeenth, eighteenth and nineteenth flip-flops 331, 332 and 333. The seventeenth, eighteenth and nineteenth flip-flops 331, 332 and 333 are configured to receive, store, and output the output of the first address storage unit 310. Here, the seventeenth, eighteenth and nineteenth flip-flops 331, 332 and 333 operate in response to the second control pulse ctrl_pulse_BK2.

The fourth address storage unit 340 is configured to receive and store the output of the second address storage unit 320 in response to the fifth control pulse ctrl_pulse_BKB2. That is, when the second group column address strobe pulse CASP6_BKB is generated and the three cycles of the clock CLK pass, the fourth address storage unit 340 receives, stores and outputs the second group external addresses Address_BKB<0:2> received when the one cycle of the clock CLK passes after the second group column address strobe pulse CASP6_BKB is generated.

The fourth address storage unit 340 includes twentieth, twenty-first, and twenty-second flip-flops 341, 342 and 343. The twentieth, twenty-first, and twenty-second flip-flops 341, 342 and 343 are configured to receive, store, and output the output of the second address storage unit 320. Here, the twentieth, twenty-first, and twenty-second flip-flops 341, 342 and 343 operate in response to the fifth control pulse ctrl_pulse_BKB2.

The fifth address storage unit 350 is configured to receive and store the output of the third address storage unit 330 in response to the third control pulse ctrl_pulse_BK3, and output the first group internal addresses Address_BK_dl<0:2>. According to an example, when the first group column address strobe pulse CASP6_BK is input and five cycles of the clock CLK pass, the fifth address storage unit 350 outputs the first group external addresses Address_BK<0:2>, received when the one cycle of the clock CLK passes after the first group column address strobe pulse CASP6_BK is input, as the first group internal addresses Address_BK_dl<0:2>.

The fifth address storage unit 350 includes twenty-third, twenty-fourth and twenty-fifth flip-flops 351, 352 and 353. The twenty-third, twenty-fourth and twenty-fifth flip-flops 351, 352 and 353 are configured to receive and store the output of the third address storage unit 330 in response to the third control pulse ctrl_pulse_BK3, and output the first group internal addresses Address_BK_dl<0:2>.

The sixth address storage unit 360 is configured to receive and store the output of the fourth address storage unit 340 in response to the sixth control pulse ctrl_pulse_BKB3, and output the second group internal addresses Address_BKB_dl<0:2>. According to an example, when the second group column address strobe pulse CASP6_BKB is input and the five cycles of the clock CLK pass, the sixth address storage unit 360 outputs the second group external addresses Address_BKB<0:2>, received when the one cycle of the clock CLK passes after the second group column address strobe pulse CASP6_BKB is input, as the second group internal addresses Address_BKB_dl<0:2>.

The sixth address storage unit 360 includes twenty-sixth, twenty-seventh and twenty-eighth flip-flops 361, 362 and 363. The twenty-sixth, twenty-seventh and twenty-eighth flip-flops 361, 362 and 363 are configured to receive and store the output of the fourth address storage unit 340 in response to the sixth control pulse ctrl_pulse_BKB3, and output the second group internal addresses Address_BKB_dl<0:2>.

The first, second, . . . , and sixth address storage units 310, 320, . . . , and 360 are arranged in parallel to one another. In more detail, the address storage units 320, 340 and 360, which receive the fourth, fifth and sixth control pulses ctrl_pulse_BKB1, ctrl_pulse_BKB2 and ctrl_pulse_BKB3 obtained by delaying the second group column address strobe pulse CASP6_BKB, are respectively arranged among the address storage units 310, 330 and 350 which receive the first, second and third control pulses ctrl_pulse_BK1, ctrl_pulse_BK2 and ctrl_pulse_BK3 obtained by delaying the first group column address strobe pulse CASP6_BK. That is, the address storage units 320, 340 and 360, which respond the second group column address strobe pulse CASP6_BKB, are respectively arranged among the address storage units 310, 330 and 350, which respond the first group column address strobe pulse CASP6_BK, so that the address storage units 310, 330 and 350 are positioned nearest the address storage units 320, 340 and 360, respectively.

In more detail, the first, second, . . . , and fifth flip-flops 101, 102, . . . , and 105 illustrated in FIG. 5 are serially connected one another in a first direction, and the sixth, seventh and tenth flip-flops 201, 202, . . . , and 205 are serially connected one another in parallel to the first direction. Here, the sixth flip-flop 201 is arranged, for example, perpendicularly to the first direction in which the second flip-flop 102 is arranged. The eleventh, twelfth and thirteenth flip-flops 311, 312 and 313 are arranged, for example, perpendicularly to the first direction in which the first flip-flop 101 is arranged, and the fourteenth, fifteenth and sixteenth flip-flops 321, 322 and 323 are arranged, for example, perpendicularly to the first direction in which the sixth flip-flop 201 is arranged. The seventeenth, eighteenth and nineteenth flip-flops 331, 332 and 333 are arranged, for example, perpendicularly to the first direction in which the third flip-flop 103 is arranged, and the twentieth, twenty-first and twenty-second flip-flops 341, 342 and 343 are arranged, for example, perpendicularly to the first direction in which the eighth flip-flop 203 is arranged. The twenty-third, twenty-fourth and twenty-fifth flip-flops 351, 352 and 353 are arranged, for example, perpendicularly to the first direction in which the fifth flip-flop 105 is arranged, and the twenty-sixth, twenty-seventh and twenty-eighth flip-flops 361, 362 and 363 are arranged, for example, perpendicularly to the first direction in which the tenth flip-flop 205 is arranged.

Such an arrangement is for improving the area efficiency of the address delay circuit 400 of the semiconductor memory apparatus according to an embodiment.

The address delay circuit 400 of the semiconductor memory apparatus according to an embodiment delays the first group external addresses Address_BK<0:2> and the second group external addresses Address_BKB<0:2> by the five cycles of the clock CLK in response to the first group column address strobe pulse CASP6_BK and the second group column address strobe pulse CASP6_BKB, and outputs the first group internal addresses Address_BK_dl<0:2> and the second group internal addresses Address_BKB_dl<0:2>.

The address delay circuits 16, 50, 100-3 and 400 of the semiconductor memory apparatus illustrated in FIGS. 1, 2, 4 and 5 delay external addresses by five cycles of a clock and output internal addresses. However, the address delay circuit 50 illustrated in FIG. 2 can reduce a circuit area and power consumption as compared with the address delay circuit 16 illustrated in FIG. 1, and the address delay circuit 100-3 illustrated in FIG. 4 can increase an internal signal margin as compared with the address delay circuit 50 illustrated in FIG. 2. Furthermore, the address delay circuit 400 illustrated in FIG. 5 can improve the area efficiency as compared with the address delay circuit 100-3 illustrated in FIG. 4. Consequently, the address delay circuit 400 of the semiconductor memory apparatus illustrated in FIG. 5 can increase a signal margin while improving the area efficiency. So far, address delay circuits for delaying five cycles of a clock have been described as examples in an embodiments. However, in the present invention, a delay time is not limited to the five cycles of the clock.

While certain embodiments have been described above, it will be understood to those skilled in the art that the embodiments described are by way of example only. Accordingly, the address delay circuit of the semiconductor memory apparatus described herein should not be limited based on the described embodiments. Rather, the address delay circuit of the semiconductor memory apparatus described herein should only be limited in light of the claims that follow when taken in conjunction with the above description and accompanying drawings.

What is claimed is:

1. An address delay circuit of a semiconductor memory apparatus, comprising:
   a first group control pulse generation unit configured to generate a first control pulse after input of a first group column address strobe pulse and passage of a time corresponding to a first set multiple of one cycle of a clock;
   a second group control pulse generation unit configured to generate a second control pulse after input of a second group column strobe address pulse and passage of a time corresponding to a second set multiple of the one cycle of the clock;
   a first address storage unit configured to receive and store a first group external address in response to the first control pulse, and output a first group internal address; and a second address storage unit configured to receive and store a second group external address in response to the second control pulse, and output a second group internal address.

2. The address delay circuit of the semiconductor memory apparatus according to claim 1, wherein the first group column address strobe pulse and the second group column address strobe pulse are alternately input to the first group control pulse generation unit and the second group control pulse generation unit.

3. The address delay circuit of the semiconductor memory apparatus according to claim 1, wherein the first address storage unit is arranged nearest the second address storage unit.

4. The address delay circuit of the semiconductor memory apparatus according to claim 1, wherein the first group control pulse generation unit comprises:
  flip-flops serially connected to each other, wherein the number of the flip-flops corresponds to the first set multiple, and wherein each flip-flop is configured to perform input, storage and output operations in response to the clock, an initial flip-flop is configured to receive the first group column address strobe pulse, and a final flip-flop is configured to generate the first control pulse.

5. The address delay circuit of the semiconductor memory apparatus according to claim 1, wherein the second group control pulse generation unit comprises:
  flip-flops serially connected to each other wherein the number of the flip-flops corresponds to the second set multiple, and wherein each flip-flop is configured to perform input, storage and output operations in response to the clock, an initial flip-flop is configured to receive the second group column address strobe pulse, and a final flip-flop is configured to generate the second control pulse.

6. The address delay circuit of the semiconductor memory apparatus according to claim 1, wherein the first address storage unit comprises:
  a flip-flop configured to receive and store the first group external address in response to the first control pulse, and output the first group internal address.

7. The address delay circuit of the semiconductor memory apparatus according to claim 1, wherein the second address storage unit comprises:
  a flip-flop configured to receive and store the second group external address in response to the second control pulse, and output the second group internal address.

8. An address delay circuit of a semiconductor memory apparatus, comprising:
  a first group control pulse generation unit configured to generate a first control pulse when a first group column address strobe pulse is input and one cycle of a clock passes, and generate a second control pulse when a first set cycle of the clock passes after the first group column address strobe pulse is input;
  a second group control pulse generation unit configured to generate a third control pulse when a second group column strobe address pulse is input and the one cycle of the clock passes, and generate a fourth control pulse when a second set cycle of the clock passes after the second group column address strobe pulse is input;
  a first address storage unit configured to receive, store and output a first group external address, wherein the first address storage unit operates in response to the first control pulse;
  a second address storage unit configured to receive and store output of the first address storage unit in response to the second control pulse, and output a first group internal address;
  a third address storage unit configured to receive, store and output a second group external address, wherein the third address storage unit operates in response to the third control pulse; and
  a fourth address storage unit configured to receive and store output of the third address storage unit in response to the fourth control pulse, and output a second group internal address.

9. The address delay circuit of the semiconductor memory apparatus according to claim 8, wherein the first group column address strobe pulse and the second group column address strobe pulse are alternately input to the first group control pulse generation unit and the second group control pulse generation unit.

10. The address delay circuit of the semiconductor memory apparatus according to claim 8, wherein the first group control pulse generation unit comprises:
  flip-flops serially connected to each other, wherein the number of the flip-flops corresponds to a first set multiple, and wherein each flip-flop is configured to perform input, storage and output operations in response to the clock, an initial flip-flop is configured to receive and store the first group column address strobe pulse and output the first control pulse, and a final flip-flop is configured to generate the second control pulse.

11. The address delay circuit of the semiconductor memory apparatus according to claim 8, wherein the second group control pulse generation unit comprises:
  flip-flops serially connected to each other, wherein the number of the flip-flops corresponds to a second set multiple, and wherein each flip-flop is configured to perform input, storage and output operations in response to the clock, an initial flip-flop is configured to receive and store the second group column address strobe pulse and output the third control pulse, and a final flip-flop is configured to generate the fourth control pulse.

12. The address delay circuit of the semiconductor memory apparatus according to claim 8, wherein the first address storage unit is configured to receive, store and output the first group external address, wherein the first address storage unit operates in response to the first control pulse, and
  the second address storage unit is configured to receive and store the output of the first address storage unit in response to the second control pulse, and output the first group internal address.

13. The address delay circuit of the semiconductor memory apparatus according to claim 12, wherein the third address storage unit is arranged between the first address storage unit and the second address storage unit, and receive, store and output the second group external address, wherein the third address storage unit operates in response to the third control pulse, and
  the fourth address storage unit is arranged such that the second address storage unit is arranged between the third address storage unit and the fourth address storage unit, and receive and store the output of the third address storage unit in response to the fourth control pulse and output the second group internal address.

14. An address delay circuit of a semiconductor memory apparatus, comprising:
  a first group control pulse generation unit including a first flip-flop configured to receive a first group column address strobe pulse and generate a first control pulse, and second and third flip-flops configured to receive output of the first flip-flop and generate a second control pulse, wherein the second flip-flop and the third flip-flop are serially connected to each other;
a second group control pulse generation unit including a fourth flip-flop configured to receive a second group column address strobe pulse and generate a third control pulse, and fifth and sixth flip-flops configured to receive output of the fourth flip-flop and generate a fourth control pulse, wherein the fifth flip-flop and the sixth flip-flop are serially connected to each other;
a first address storage unit including a seventh flip-flop configured to receive, store and output a first group external address, wherein the seventh flip-flop operates in response to the first control pulse;
a second address storage unit including an eighth flip-flop configured to receive and store output of the first address storage unit in response to the second control pulse, and output a first group internal address;
a third address storage unit including a ninth flip-flop configured to receive, store and output a second group external address, wherein the ninth flip-flop operates in response to the third control pulse; and
a fourth address storage unit including a tenth flip-flop configured to receive and store output of the third address storage unit in response to the fourth control pulse, and output a second group internal address.

15. The address delay circuit of the semiconductor memory apparatus according to claim 14, wherein the first, second and third flip-flops are serially connected to one another in a first direction, the fourth, fifth and sixth flip-flops are serially connected to one another in parallel to the first direction, and the fourth flip-flop is arranged perpendicularly to the first direction in which the second flip-flop is arranged.

16. The address delay circuit of the semiconductor memory apparatus according to claim 14, wherein the seventh flip-flop is arranged perpendicularly to the first direction in which the first flip-flop is arranged, the eighth flip-flop is arranged perpendicularly to the first direction in which the third flip-flop is arranged, the ninth flip-flop is arranged perpendicularly to the first direction in which the fourth flip-flop is arranged, and the tenth flip-flop is arranged perpendicularly to the first direction in which the sixth flip-flop is arranged.

* * * * *